(12) United States Patent
Stangl

(10) Patent No.: US 9,470,730 B2
(45) Date of Patent: Oct. 18, 2016

(54) SELF-MONITORING POWER SUPPLY CORD AND OPERATING EQUIPMENT

(75) Inventor: Gunther Stangl, Kirchseeon (DE)

(73) Assignee: Pruftech GmbH, Haar (DE)

( * ) Notice: Subject to any disclaimer, the term of this patent is extended or adjusted under 35 U.S.C. 154(b) by 481 days.

(21) Appl. No.: 13/516,969

(22) PCT Filed: Dec. 17, 2010

(86) PCT No.: PCT/EP2010/070038
§ 371 (c)(1),
(2), (4) Date: Aug. 16, 2012

(87) PCT Pub. No.: WO2011/083029
PCT Pub. Date: Jul. 14, 2011

(65) Prior Publication Data
US 2012/0319707 A1    Dec. 20, 2012

(30) Foreign Application Priority Data

Dec. 17, 2009  (DE) .................. 10 2009 054 834
Dec. 17, 2009  (DE) .................. 20 2009 017 058 U

(51) Int. Cl.
*G01R 27/20*      (2006.01)
*G01R 31/14*      (2006.01)
(Continued)

(52) U.S. Cl.
CPC .............. *G01R 27/205* (2013.01); *G01R 31/14* (2013.01); *H01R 24/30* (2013.01); *H01R 25/003* (2013.01); *H01R 2103/00* (2013.01)

(58) Field of Classification Search
CPC ............ H02H 3/00; H02H 3/24; H02H 3/10; H02H 3/16; H02H 7/005; H02H 31/14; H01R 3/06; H01R 24/00; H01R 24/04; H01R 3/00; H01R 13/37; H01R 2103/00; H01R 25/003; H01R 24/30; G01R 31/14; G01R 27/205
USPC ......... 324/51, 52, 62; 219/544, 553; 361/42, 361/47–50, 87–88; 340/656, 664, 649, 650; 439/215
See application file for complete search history.

(56) References Cited

U.S. PATENT DOCUMENTS 3,798,540 A *  3/1974  Darden et al. ................ 324/510
3,891,894 A *  6/1975  Scarpino ........................ 361/48
(Continued)

FOREIGN PATENT DOCUMENTS

DE      1290985      3/1969
DE      29600911     6/1996
(Continued)

OTHER PUBLICATIONS

Examination Report for corresponding German Appl. No. 10 2009 054 834.3-34 dated Jun. 23, 2010.

*Primary Examiner* — Jermele M Hollington
*Assistant Examiner* — Dustin Dickinson
(74) *Attorney, Agent, or Firm* — MH2 Technology Law Group, LLP

(57) ABSTRACT

The invention relates to a power supply cord with at least two conductors N, L for transferring a supply voltage with two protective earths insulated from one another, which at the first end are conductively connected with each other and at the second end there is a measurement device provided for measurement of the resistance of a measuring circuit comprising the PE and measurement conductor P, and wherein in case of exceeding the resistance, a warning signal is output.

5 Claims, 3 Drawing Sheets

(51) Int. Cl.
*H01R 24/30* (2011.01)
*H01R 25/00* (2006.01)
*H01R 103/00* (2006.01)

(56) References Cited

U.S. PATENT DOCUMENTS

| | | | |
|---|---|---|---|
| 3,913,010 A | | 10/1975 | Scarpino |
| 4,011,483 A | * | 3/1977 | Meadows ................... 361/47 |
| 4,389,694 A | * | 6/1983 | Cornwell, Jr. ............... 361/48 |
| 5,642,248 A | * | 6/1997 | Campolo ........... H01R 13/7135 |
| | | | 361/115 |
| 5,841,617 A | * | 11/1998 | Watkins et al. ............. 361/106 |
| 7,521,943 B2 | * | 4/2009 | Binder et al. ............... 324/691 |
| 2003/0151413 A1 | * | 8/2003 | Elms ........................... 324/541 |
| 2004/0001292 A1 | * | 1/2004 | Vanderkolk .................. 361/42 |
| 2004/0136125 A1 | * | 7/2004 | Nemir et al. ................. 361/42 |
| 2008/0007878 A1 | * | 1/2008 | Gandolfi ................. H02H 3/14 |
| | | | 361/42 |
| 2008/0055801 A1 | * | 3/2008 | O'Rourke ..................... 361/49 |
| 2008/0106832 A1 | * | 5/2008 | Restrepo ............. H02H 1/0015 |
| | | | 361/42 |
| 2009/0040666 A1 | * | 2/2009 | Elms ....................... H02H 3/334 |
| | | | 361/42 |
| 2009/0160427 A1 | * | 6/2009 | Drake .............. G01R 19/16566 |
| | | | 324/72 |

FOREIGN PATENT DOCUMENTS

| | | |
|---|---|---|
| DE | 202004008334 | 9/2004 |
| DE | 69836806 | 10/2007 |
| EP | 0715172 | 6/1996 |
| GB | 2128047 | 4/1984 |
| GB | 2444850 | 6/2008 |

* cited by examiner

SELF-MONITORING POWER SUPPLY CORD AND OPERATING EQUIPMENT

TECHNICAL FIELD

The invention relates to a power supply cord according to the preamble of claim 1, an operating equipment, a building installation and a method for detecting a fault in a power supply cord and in particular in an operating equipment.

BACKGROUND ART

Electrical devices are provided with a power supply cord. It is possible that the power supply cord or the operating equipment get damaged. If such a damage is not detected, an endangerment of the operators arises, as for example an electrical shock and a security problem, as for example a fire hazard due to overheating.

Pursuant to standard DIN-VDE 0701-0702, inter alia, the following tests have to be carried out in regular time intervals:

1. Resistance measurement, in particular of the protective earth (RSL).
2. Protective earth current, wherein it is measured whether in a connected device or its power supply cord a protective earth current, i.e. a residual current, occurred.
3. Visual inspection.

The problem underlying the present invention is to provide a power supply cord for which a damage can easily and reliably be detected through a user.

SUMMARY OF INVENTION

According to the invention a power supply cord with at least two conductors N and L is provided for the transfer of a supply voltage or a mains voltage, wherein the power supply cord further has a protective earth PE and a measurement conductor P, which are connected conductively with each other at a first end of the power supply cord. Either the power supply cord comprises at the second end a measurement device that is adapted to measure the resistance over a measuring circuit comprising the protective earth PE and the measuring conductor P, and in case of exceeding the resistance outputs a warning signal. Alternatively, the power supply cord comprises at the second end a coupling, as for example a plug connection, that is adapted to be connected with a corresponding counter part of a connectable device, so that over a measuring device of this device the resistance of a measurement circuit comprising the protective earth can be measured, and in case of exceeding the resistance, a warning signal (optical or acoustical) can be output.

An increase of the resistance, as for example in case of damage to the line of the protective earth PE, is early detected by the use of the additional measuring conductor P over the measuring circuit. Thus, the cycles of regular inspection can be extended in a legally binding manner by a risk assessment according to the industrial safety regulations, as now the proof of the compliance with the maximum permissible protective earth resistances of the monitored operating equipment is given continuously (recognizable for the non-skilled person). Accordingly costs are saved. According to the invention it is not essential; whether the resistance measurement is integrated in the power supply cord itself, or whether it is outsourced into a connected operating equipment.

Furthermore, the measuring device comprises an ammeter for measuring of the protective earth current. As explained in detail later with the embodiment, due to the protective earth PE and the measuring conductor P running parallel in the power supply cord, the protective earth current of a connected operating equipment can be measured during operation, in particular with no alterations in setup being necessary. The orderly functioning of the resources can be checked continuously and simply for the non-skilled person as with the resistance measurement.

It is of advantage to have a power plug connected at the first end of the power supply cord which allows for easy and simple integration of the power supply cord according to the invention into an existing electrical infrastructure. In particular the power plug is a standard plug, in particular a protective contact or shock-proof plug or non-heating apparatus plug.

An electrical equipment with a power supply cord, as in particular an electrical load, an extension cable, a cable drum or a multi-socket adapter comprises an appropriate measurement device and the power supply cord is connectable to the device either inseparably or over a separable connection. If the device already has electrical/electronical circuits, those can cost-efficiently be expanded by the described measurement functions. In case of a separable power supply cord, the power supply cord can be exchanged easily and cost-efficiently when being damaged.

Further, the power supply cord can be used in a building installation, wherein the measuring device is provided at the end of the connection cable in the building and is adapted for measuring the protective earth current and the protective earth resistance.

In an according method for detecting a fault in a measuring circuit of a power supply cord with a protective earth PE and a measurement conductor P and a power plug, a function test/a calibration function is carried out and temporarily displayed by a functional message as in particular in form of light signaling or a short acoustical signal; after the power plug is plugged into a socket. Hereby, similar to the car airbag, a feedback on the orderly functioning of the measurement device can be given to the user in the beginning. The measuring device subsequently measures, preferably continuously, the resistance of the measuring circuit and/or the protective earth current and outputs a warning signal in case of exceeding an inadmissible resistance value.

If the measuring device continuously measures the resistance and/or the protective earth current, a damage of the power supply cord can be detected with little technical effort. Furthermore, a fault or a damage of the operating equipment connected to the power supply cord can be detected.

BRIEF DESCRIPTION OF THE DRAWINGS

By means of the drawings one embodiment of the invention hereinafter is explained in detail. It is shown by.

DETAILED DESCRIPTION OF THE EMBODIMENTS

Figure 1:
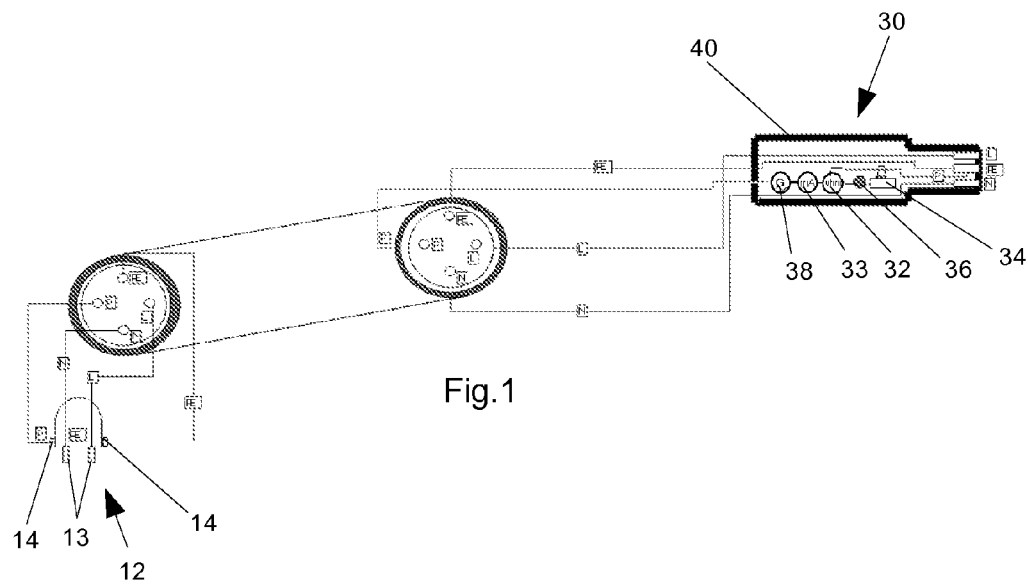
FIG. 1 a schematic presentation of the power supply cord with a coupling integrated measurement device (as e.g. a non-heating apparatus power supply cord), FIG. 2 a schematic presentation of the power supply cord with a connected electrical device, such as a non-heating apparatus conductor with test wire P parallel to the protective earth, FIG. 3 the embodiment with a 3-fold multi(-socket) adapter 230V and FIG. 4 a building installation.

The power supply cord 10 of FIG. 1 comprises four conductors, namely L as phase and N as neutral conductor, PE as protective earth and P as measurement conductor.

At the first end of power supply cord 10 a power plug 12 is provided, for which the conductors N and L are connected to its connection contacts 13 and the protective earth PE and the measurement conductor P are connected to the protective earth contact 14 of the power plug 12. At the other end of the power supply cord a second plug or coupling 40 is arranged. In this second plug 40 a measurement device 30 can be integrated, comprising a power supply 38, an ohmmeter 32, an acoustic warning device 34, an indicator lamp 36 and an ammeter 32. Within the second plug 40 the ohmmeter 32 is connected to the protective earth PE with its one measuring potential and connected with its second end to the measurement conductor P over the interconnected power supply 38, so that a control circuit or measuring circuit is formed, which comprises the conductors PE and P over the length of the power supply cord. A break of one of the conductors PE or P or an according increase in resistance, which may arise due to damaging, is detected by the ohmmeter 32. Over an indicator lamp 36 and/or an acoustic warning device 34, an according warning can be outputted. Due to this warning signals the user recognizes the damage of the power supply cord 10 and, accordingly, can exchange it or inform the technical service.

Further, in the measuring device 30 an ammeter 33 is provided for measuring the protective earth current in the measurement conductor P. In case of a measurement, an electrical device/load (not shown) is connected at the second plug 40 with the three contacts N, L and PE. If a fault is present in this device, a protective earth current occurs, which is transferred to the potential PE of the plug 40 and, thus, on the one hand is forwarded over the protective earth PE via the power supply cord 10 to the first power plug 12 and correspondingly is discharged. On the other hand the potential PE of the power plug 12 is connected to the measurement conductor P that also, as already described, is connected to protective earth contact 14 of the first power plug 12 via the measuring device 30. Hence, PE and P are connected in parallel. Thus, the residual current of the connected device will be split or spread over both conductors P and PE. If the resistance of the measurement conductor P corresponds to the resistance of the protective earth PE, the residual current will be split in half according to a current divider. The ammeter 32 measures the current flowing over the measurement conductor P and can detect in case of appropriate measurement results (as explained further down) that a protective earth current was introduced into the measuring circuit via the PE contact of the second plug 40. Accordingly, the ammeter can output a warning over the indicator lamp 36 and/or the acoustic warning device 34. Alternatively and/or additionally the transmission of the signal can be carried out using a transponder.

Due to the grounding of the connected device over the parallel running conductors P and PE, the connection of the protective earth PE does not have to be interrupted and, thus, a measurement during operation, in particular continuously, is possible.

If a damaged line is not exchanged, an endangerment for the operators or a fire hazard may arise. For this reason, inspections of operating equipment, conductors or cables are prescribed according to the standard DIN VDI 0701-0702 or the industrial safety regulations. The control interval is set by the operator according to a risk assessment that has to be carried out. Because the described power supply cord carries out a measurement test itself, the test cycle can be increased. In order to detect a fault in the measurement device itself, the measurement device 30 is adapted so that the measurement device 30 reacts with a temporary glow of the indicator lamp 36 of about 1-2 seconds and/or with a tone of the acoustic warning device 34; when plugging-in the power plug 12 into an according socket signaling to the user that the measurement device 30 works faultlessly. If the measurement device does not output such a signaling, a fault is pointed out to the user, so that the power supply cord 10 has to be exchanged as well.

The power supply 38 decouples a low voltage out of the mains voltage over the potentials N and L. This happens over a galvanic isolation, in order to keep the mains voltage separated from the protective earth P and PE.

The ohmmeter 30 has a threshold of around 150 mΩ, which, thus, is smaller than the conventionally used threshold of no more than 300 mΩ, as the contact resistances are lower. The ohmmeter outputs the warning if the measured resistance exceeds the threshold. In the present embodiment the test current amounts to 200 mA, but can be adjusted. The protective earth PE is used for grounding and is defined with regards to cross-section and quality in corresponding standards. This is not the case for the measurement conductor P, which is used for the test task. For this reason it can have a different, in particular a smaller cross-section, in order to save material and costs. Hereby, the described split of the protective earth current for a connected device is changed accordingly.

Figure 2:
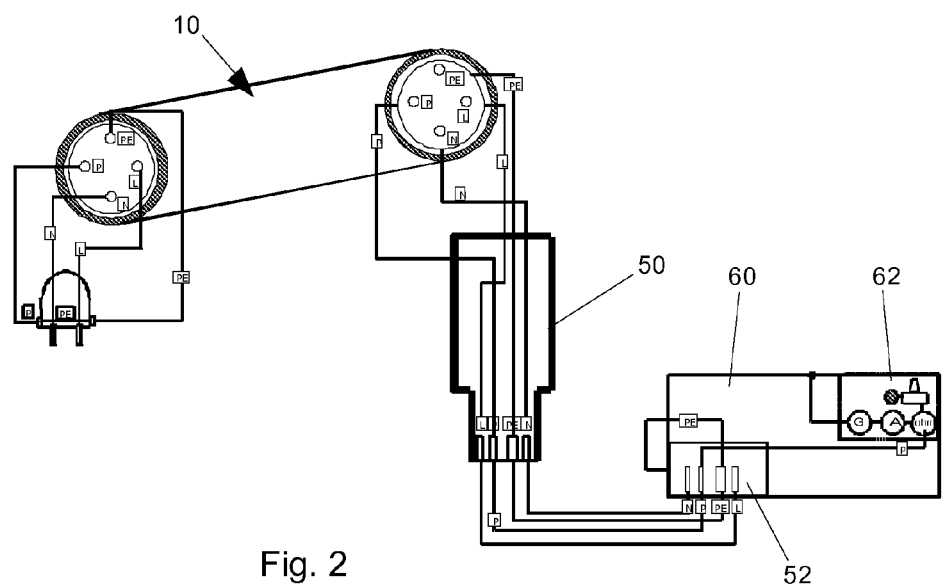

FIG. 2 shows an alternative embodiment, wherein the second end of the power supply cord 10 also has a plug or a coupling 50. Hereby, however, in this coupling 50 there is no measurement device integrated. Instead the coupling 50 can be connected to a coupling counterpart 52 of an electrical device/operating equipment 60, comprising a measurement device 62, which works comparably to the measurement device 30 already described. In the device the potential of the protective earth PE is used for grounding by connecting it to the parts to be grounded, in particular to the housing. The measurement device 62 measures the resistance between the housing of the device 60 and the potential P, including the contact resistances of the plugs, hence, in particular the non-heating power supply cords to the connector socket of the operating equipment. The connected device 30 can be any load as for example a household appliance, a workshop unit, a computer or also for example a passive device, such as a cable drum. Thus, according to the first embodiment, the measurement device 62 can itself detect a damage of the power supply cord 10, the plugs, as well as a protective earth current in the device during operation.

Figure 3:
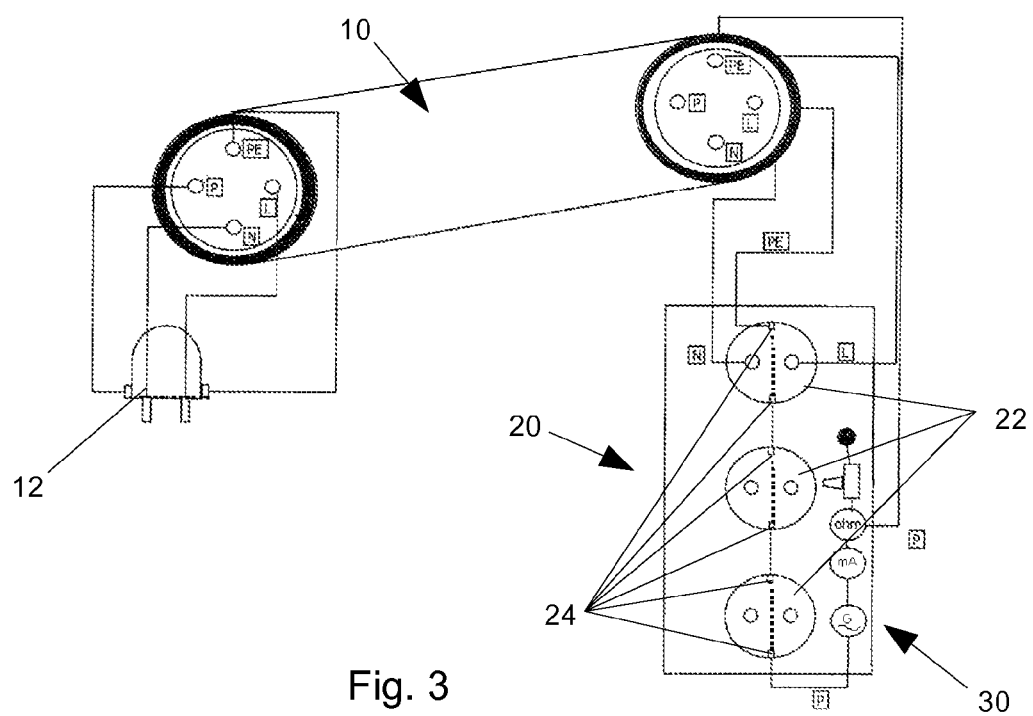

Alternatively to the device 60 the power supply cord 10 can be connected to a multi-socket adapter 20 according to FIG. 3. The multi-socket adapter 20 comprises three slots/sockets 22 for plugs to be plugged in and each socket has two protective earth contacts 24, which within each socket are connected to each other. The measurement device is setup in such a way that the measuring circuit runs over the protective earth of the individual sockets 22 via the protective earth PE of the power supply cord to the power plug 12 at the first end power supply cord 10, via the measurement conductor P back to the multi-socket adapter 20 and there to measurement device 30. Hereby, it can be detected in the resistance measurement test, whether the protective earth contacts of the socket 20 are properly connected, in particular with a connection of low resistance to the protective earth contact 14 of the power plug 12. Further, via the measurement of the current in the ammeter 33, as described above, a fault of the operating equipment connected to the ammeter 33 can be detected in the protective earth current of a connected device and the flaw can be made acoustically or visually recognizable for the user.

Figure 4:
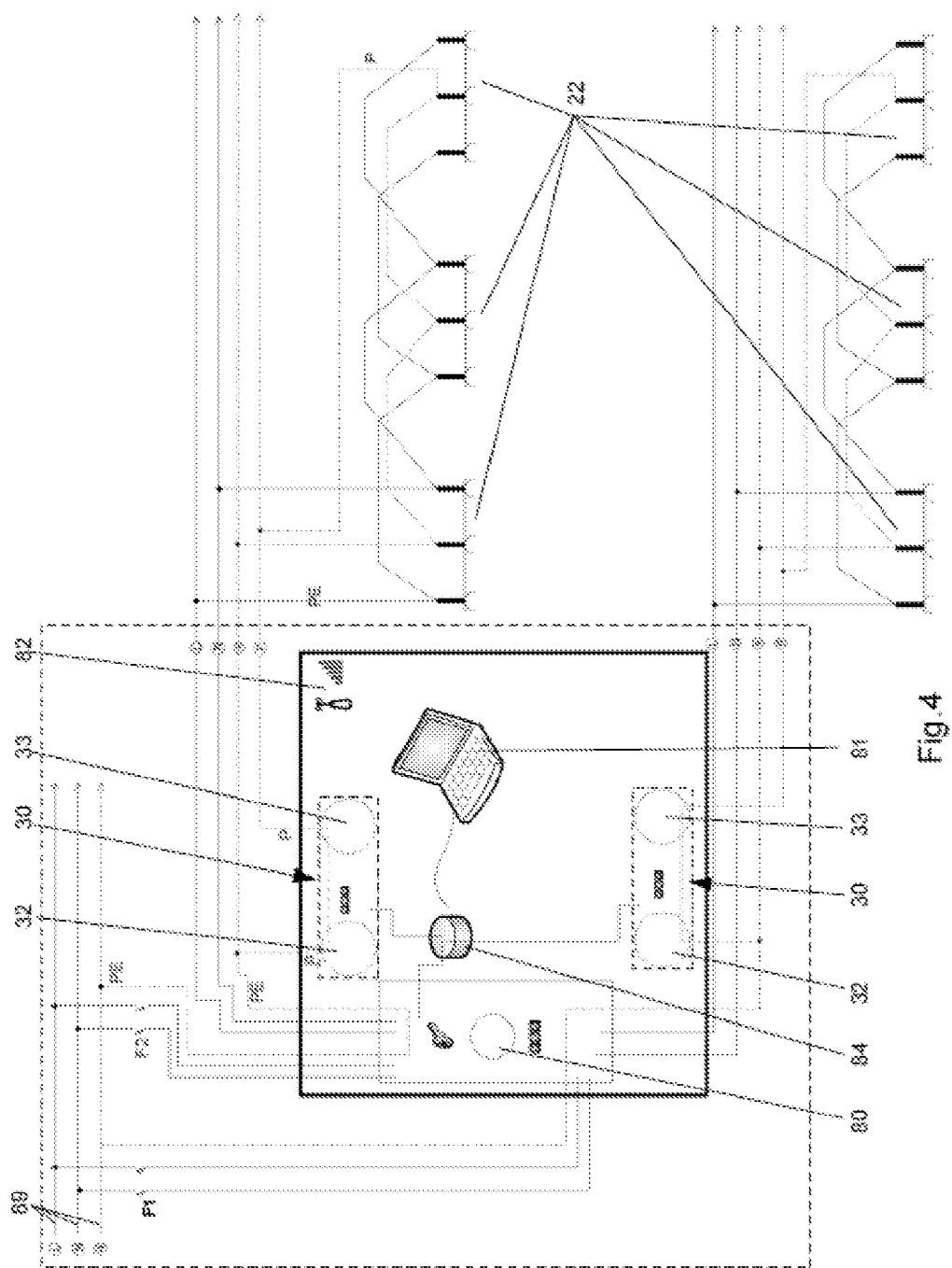

FIG. 4 shows a building installation, with mains 89 providing the potentials L, N and PE, which are led over fuses F1 and F2 to a controller 80, respectively. From the controller two power supply cords 10 come off, which, as already described, next to the protective earth PE also comprise the measurement conductor P. These power supply cords lead to e.g. a multi-socket adapter or (in particular stationary installed) (a) socket(s) 22, which e.g. are integrated in a floor tank (or floor outlet). There the power supply cord 10 is connected with both potentials for conductors N and L to protective earth PE. At a socket 22, distant from the socket on which PE is connected, the measurement conductor P is connected, so that a conducting connection from PE to P is provided over all sockets. This complies with the contacting as already described in the embodiment of FIG. 3. With this arrangement the same measurements are possible as described in the embodiments above. Thus, an incorrect contacting can be detected over a resistance measurement at measurement conductor P. Thereby, the controller 80 comprises two measurement devices 30, each of which is connected to a measurement conductor P of one of the power supply cords 10. The described continuous measurements of the resistance and the protective earth current can be carried out over the controller. The results can be forwarded over a status analysis 85 either via radio or Internet. Hereby, an alerting of a caretaker or a service point is possible when exceeding the threshold values. Further to both the power supply cords 10, the controller can also be connected to further power supply cords.

Further, the controller 80 can comprise a device for insulation measurement (not shown). In order to carry out a corresponding insulation measurement all loads have to be removed from the sockets 22, and subsequently the inspection can be started manually and an insulation measurement can be carried out with high voltage according to DIN VDE 0105-100 in order to measure the insulation resistance of the power supply cord 10 and the sockets 22.

Because all connected devices necessarily have to be removed before the measurement, this measurement must only be carried out by a qualified electrician.

The inventive idea comprises power supply cords with more than two conductors as e.g. three conductors for the three-phase-alternating current (rotary current) or more conductors.

REFERENCE SIGNS 10 power supply cord
12 power plug
13 connection contacts
14 protective earth contact
20 multi socket adapter
22 socket
24 protective earth contact
30 measurement device
32 ohmmeter
33 ammeter
34 acoustic warning device
36 indicator lamp
38 power supply
40 second plug/coupling
50 plug/coupling
52 coupling counterpart
60 (electrical) device
62 measurement device
80 controller
81 computer
82 status forwarding
84 data storage
89 mains
P measurement conductor
PE protective earth
L conductor (phase)
N neutral conductor

The invention claimed is:

1. Power supply cord (10) with a power plug (12) at its first end, a second plug or coupling (40) at its second end and at least two conductors (N, L) for transferring a supply voltage, a protective earth (PE) and a measurement conductor (P), wherein the conductors (N, L) are connected to connection contacts (13) of the power plug (12) and the protective earth (PE) and the measurement conductor (P) are both connected to a protective earth contact (14) of the power plug (12), and in the second plug or coupling (40) a measuring device (30) is integrated, the measuring device (30) being adapted to measure a resistance over a measuring circuit comprising the protective earth (PE) and the measurement conductor (P) and adapted to output a warning signal in case of an increasing resistance, wherein the protective earth (PE) and the measurement conductor (P) a are connect parallel.

2. The power supply cord (10) according to claim 1, characterized in that the measuring device (30) comprises an ammeter (33) for measuring the protective earth current.

3. The power supply cord (10) according to claim 1, characterized in that the power plug (12) is a standard plug, in particular a protective-contact or shock-proof plug or a non-heating apparatus plug.

4. The power supply cord (10) according to claim 1, characterized in that the protective earth (PE) and the measurement conductor (P) have different cross-sections.

5. A power supply cord having a first end and a second end, the power supply cord comprising:
a power plug proximate to the first end;
a second plug or a coupling proximate to the second end, wherein the second plug or the coupling comprises a measuring device integrated therein;
first and second conductors connected to connection contacts of the power plug, wherein the first and second conductors are configured to transfer a supply voltage; and
third and fourth conductors connected to a protective earth contact of the power plug, wherein the third and fourth conductors are connected in parallel, wherein the measuring device is adapted to measure a resistance over a measuring circuit that comprises the third and fourth conductors, and wherein the measuring device is adapted to output a warning signal when an increasing resistance is detected.

* * * * *